(12) United States Patent  
Hikichi

(10) Patent No.: US 11,962,302 B2  
(45) Date of Patent: Apr. 16, 2024

(54) SEMICONDUCTOR DEVICE

(71) Applicant: ABLIC Inc., Tokyo (JP)

(72) Inventor: Tomoki Hikichi, Tokyo (JP)

(73) Assignee: ABLIC Inc., Nagano (JP)

( * ) Notice: Subject to any disclaimer, the term of this patent is extended or adjusted under 35 U.S.C. 154(b) by 0 days.

(21) Appl. No.: 17/689,985

(22) Filed: Mar. 9, 2022

(65) Prior Publication Data

US 2022/0311425 A1  Sep. 29, 2022

(30) Foreign Application Priority Data

Mar. 23, 2021 (JP) ................................. 2021-048068

(51) Int. Cl.
*H03K 3/037* (2006.01)
*G01D 5/14* (2006.01)
*H03F 3/04* (2006.01)
*H03K 5/24* (2006.01)

(52) U.S. Cl.
CPC ............ *H03K 3/037* (2013.01); *G01D 5/145* (2013.01); *H03F 3/04* (2013.01); *H03K 5/24* (2013.01)

(58) Field of Classification Search
CPC .......... H03K 3/037; H03K 5/24; G01D 5/145; H03F 3/04
See application file for complete search history.

(56) References Cited

U.S. PATENT DOCUMENTS

| | | | |
|---|---|---|---|
| 6,927,600 B2 * | 8/2005 | Choe ................ | G01R 31/31715 326/32 |
| 8,816,682 B2 * | 8/2014 | Hayashi ................ | G01D 5/147 324/244 |
| 2010/0026281 A1 * | 2/2010 | Nishikawa .......... | G01R 33/0023 324/207.13 |
| 2016/0241222 A1 | 8/2016 | Ariyama | |

FOREIGN PATENT DOCUMENTS

| | | | | |
|---|---|---|---|---|
| CN | 108427083 A | * | 8/2018 | ............. G01D 5/145 |
| JP | 2009002851 | | 1/2009 | |
| JP | 2010056260 A | * | 3/2010 | |
| JP | 2015095727 | | 5/2015 | |

\* cited by examiner

*Primary Examiner* — Metasebia T Retebo  
*Assistant Examiner* — James G Yeaman  
(74) *Attorney, Agent, or Firm* — JCIPRNET

(57) ABSTRACT

A semiconductor device includes a magnetic switch provided on a semiconductor substrate. The magnetic switch includes: a Hall element, first and second power supply terminals; a current source driving the Hall element; a switch circuit switching a differential output voltage supplied from two electrodes of the Hall element to a first or second state based on a control signal supplied from a control terminal; an amplifier amplifying a signal from the switch circuit; a reference voltage circuit generating a reference voltage based on a reference common mode voltage and a control signal; a comparator receiving an output signal of the amplifier and the reference voltage; and a latch circuit latching an output voltage of the comparator. The reference voltage of the reference voltage circuit is controlled by switching from a reference value to a voltage with a high or low adjustment value according to the output voltage of the comparator.

7 Claims, 14 Drawing Sheets

| 702 | D[3:0] | $I_{DAC}$ [LSB] | $V_R$ | 941 (+4LSB) | 942 (+2LSB) | 943 (+1LSB) | 944 (−1LSB) | 945 (−2LSB) | 946 (−4LSB) |
|---|---|---|---|---|---|---|---|---|---|
| H (=1) | 0000 | 0 | $V_{REF}$ | 0 | 0 | 0 | 0 | 0 | 0 |
| | 0001 | −1 | $V_{REF}-\Delta V$ | 0 | 0 | 0 | 1 | 0 | 0 |
| | 0010 | −2 | $V_{REF}-2\Delta V$ | 0 | 0 | 0 | 0 | 1 | 0 |
| | 0011 | −3 | $V_{REF}-3\Delta V$ | 0 | 0 | 0 | 1 | 1 | 0 |
| | 0100 | −4 | $V_{REF}-4\Delta V$ | 0 | 0 | 0 | 0 | 0 | 1 |
| | 0101 | −5 | $V_{REF}-5\Delta V$ | 0 | 0 | 0 | 1 | 0 | 1 |
| | 0110 | −6 | $V_{REF}-6\Delta V$ | 0 | 0 | 0 | 0 | 1 | 1 |
| | 0111 | −7 | $V_{REF}-7\Delta V$ | 0 | 0 | 0 | 1 | 1 | 1 |
| | 1000 | 0 | $V_{REF}$ | 0 | 0 | 0 | 0 | 0 | 0 |
| | 1001 | +1 | $V_{REF}+\Delta V$ | 0 | 0 | 1 | 0 | 0 | 0 |
| | 1010 | +2 | $V_{REF}+2\Delta V$ | 0 | 1 | 0 | 0 | 0 | 0 |
| | 1011 | +3 | $V_{REF}+3\Delta V$ | 0 | 1 | 1 | 0 | 0 | 0 |
| | 1100 | +4 | $V_{REF}+4\Delta V$ | 1 | 0 | 0 | 0 | 0 | 0 |
| | 1101 | +5 | $V_{REF}+5\Delta V$ | 1 | 0 | 1 | 0 | 0 | 0 |
| | 1110 | +6 | $V_{REF}+6\Delta V$ | 1 | 1 | 0 | 0 | 0 | 0 |
| | 1111 | +7 | $V_{REF}+7\Delta V$ | 1 | 1 | 1 | 0 | 0 | 0 |
| L (=0) | 0000 | 0 | $V_{REF}$ | 0 | 0 | 0 | 0 | 0 | 0 |
| | 0001 | +1 | $V_{REF}+\Delta V$ | 0 | 0 | 1 | 0 | 0 | 0 |
| | 0010 | +2 | $V_{REF}+2\Delta V$ | 0 | 1 | 0 | 0 | 0 | 0 |
| | 0011 | +3 | $V_{REF}+3\Delta V$ | 0 | 1 | 1 | 0 | 0 | 0 |
| | 0100 | +4 | $V_{REF}+4\Delta V$ | 1 | 0 | 0 | 0 | 0 | 0 |
| | 0101 | +5 | $V_{REF}+5\Delta V$ | 1 | 0 | 1 | 0 | 0 | 0 |
| | 0110 | +6 | $V_{REF}+6\Delta V$ | 1 | 1 | 0 | 0 | 0 | 0 |
| | 0111 | +7 | $V_{REF}+7\Delta V$ | 1 | 1 | 1 | 0 | 0 | 0 |
| | 1000 | 0 | $V_{REF}$ | 0 | 0 | 0 | 0 | 0 | 0 |
| | 1001 | −1 | $V_{REF}-\Delta V$ | 0 | 0 | 0 | 1 | 0 | 0 |
| | 1010 | −2 | $V_{REF}-2\Delta V$ | 0 | 0 | 0 | 0 | 1 | 0 |
| | 1011 | −3 | $V_{REF}-3\Delta V$ | 0 | 0 | 0 | 1 | 1 | 0 |
| | 1100 | −4 | $V_{REF}-4\Delta V$ | 0 | 0 | 0 | 0 | 0 | 1 |
| | 1101 | −5 | $V_{REF}-5\Delta V$ | 0 | 0 | 0 | 1 | 0 | 1 |
| | 1110 | −6 | $V_{REF}-6\Delta V$ | 0 | 0 | 0 | 0 | 1 | 1 |
| | 1111 | −7 | $V_{REF}-7\Delta V$ | 0 | 0 | 0 | 1 | 1 | 1 |

FIG. 5

| 702 | D[3:0] | Resistance | $V_R$ | 941B (+4LSB) | 942B (+4LSB) | 943B (+2LSB) | 944B (+2LSB) | 945B (+1LSB) | 946B (+1LSB) |
|---|---|---|---|---|---|---|---|---|---|
| H (=1) | 0000 | R | $V_{REF}$ | 1 | 0 | 1 | 0 | 1 | 0 |
| | 0001 | R-ΔR | $V_{REF}$-ΔV | 1 | 0 | 1 | 0 | 0 | 0 |
| | 0010 | R-2ΔR | $V_{REF}$-2ΔV | 1 | 0 | 0 | 0 | 1 | 0 |
| | 0011 | R-3ΔR | $V_{REF}$-3ΔV | 1 | 0 | 0 | 0 | 0 | 0 |
| | 0100 | R-4ΔR | $V_{REF}$-4ΔV | 0 | 0 | 1 | 0 | 1 | 0 |
| | 0101 | R-5ΔR | $V_{REF}$-5ΔV | 0 | 0 | 1 | 0 | 0 | 0 |
| | 0110 | R-6ΔR | $V_{REF}$-6ΔV | 0 | 0 | 0 | 0 | 1 | 0 |
| | 0111 | R-7ΔR | $V_{REF}$-7ΔV | 0 | 0 | 0 | 0 | 0 | 0 |
| | 1000 | R | $V_{REF}$ | 1 | 0 | 1 | 0 | 1 | 0 |
| | 1001 | R+ΔR | $V_{REF}$+ΔV | 1 | 0 | 1 | 0 | 1 | 1 |
| | 1010 | R+2ΔR | $V_{REF}$+2ΔV | 1 | 0 | 1 | 1 | 1 | 0 |
| | 1011 | R+3ΔR | $V_{REF}$+3ΔV | 1 | 0 | 1 | 1 | 1 | 1 |
| | 1100 | R+4ΔR | $V_{REF}$+4ΔV | 1 | 1 | 1 | 0 | 1 | 0 |
| | 1101 | R+5ΔR | $V_{REF}$+5ΔV | 1 | 1 | 1 | 0 | 1 | 1 |
| | 1110 | R+6ΔR | $V_{REF}$+6ΔV | 1 | 1 | 1 | 1 | 1 | 0 |
| | 1111 | R+7ΔR | $V_{REF}$+7ΔV | 1 | 1 | 1 | 1 | 1 | 1 |
| L (=0) | 0000 | R | $V_{REF}$ | 1 | 0 | 1 | 0 | 1 | 0 |
| | 0001 | R+ΔR | $V_{REF}$+ΔV | 1 | 0 | 1 | 0 | 1 | 1 |
| | 0010 | R+2ΔR | $V_{REF}$+2ΔV | 1 | 0 | 1 | 1 | 1 | 0 |
| | 0011 | R+3ΔR | $V_{REF}$+3ΔV | 1 | 0 | 1 | 1 | 1 | 1 |
| | 0100 | R+4ΔR | $V_{REF}$+4ΔV | 1 | 1 | 1 | 0 | 1 | 0 |
| | 0101 | R+5ΔR | $V_{REF}$+5ΔV | 1 | 1 | 1 | 0 | 1 | 1 |
| | 0110 | R+6ΔR | $V_{REF}$+6ΔV | 1 | 1 | 1 | 1 | 1 | 0 |
| | 0111 | R+7ΔR | $V_{REF}$+7ΔV | 1 | 1 | 1 | 1 | 1 | 1 |
| | 1000 | R | $V_{REF}$ | 1 | 0 | 1 | 0 | 1 | 0 |
| | 1001 | R-ΔR | $V_{REF}$-ΔV | 1 | 0 | 1 | 0 | 0 | 0 |
| | 1010 | R-2ΔR | $V_{REF}$-2ΔV | 1 | 0 | 0 | 0 | 1 | 0 |
| | 1011 | R-3ΔR | $V_{REF}$-3ΔV | 1 | 0 | 0 | 0 | 0 | 0 |
| | 1100 | R-4ΔR | $V_{REF}$-4ΔV | 0 | 0 | 1 | 0 | 1 | 0 |
| | 1101 | R-5ΔR | $V_{REF}$-5ΔV | 0 | 0 | 1 | 0 | 0 | 0 |
| | 1110 | R-6ΔR | $V_{REF}$-6ΔV | 0 | 0 | 0 | 0 | 1 | 0 |
| | 1111 | R-7ΔR | $V_{REF}$-7ΔV | 0 | 0 | 0 | 0 | 0 | 0 |

FIG. 13

SEMICONDUCTOR DEVICE

CROSS-REFERENCE TO RELATED APPLICATION

This application claims the priority benefit of Japan application serial no. 2021-048068, filed on Mar. 23, 2021. The entirety of the above-mentioned patent application is hereby incorporated by reference herein and made a part of this specification.

BACKGROUND

Field of the Invention

The present invention relates a semiconductor device.

Description of the Related Art

A Hall element is used for various applications as a magnetic sensor because the Hall element can detect a position and an angle in a non-contact manner. As an example of the applications of the Hall element, there is a magnetic switch. The magnetic switch includes, for example, a Hall element and peripheral circuits including an amplifier and a comparator, and is formed by packaging the Hall element and the peripheral circuits on a semiconductor chip. In regard to classification of the magnetic switch with attention being given to methods of detecting magnetism, there are known a bipolar detection type capable of detecting magnetic fields of both the South pole (hereinafter, referred to as "S-pole") and the North pole (hereinafter, referred to as "N-pole") and an alternation detection type capable of detecting an alternating magnetic field of the S-pole and N-pole alternating with a lapse of time.

In an alternation detection type magnetic switch and a bipolar detection type magnetic switch, a symmetric property between an S-pole side threshold value and an N-pole side threshold value is important. Meanwhile, an asymmetric property occurs due to influences of offset voltages of the Hall element itself and the amplifier and comparator arranged in stages subsequent to the Hall element.

The magnetic switch may have a hysteresis width set from the viewpoint of preventing chattering of an output signal due to internal and disturbance noise at the time of applying a zero magnetic field. The hysteresis width is defined by a difference between an operating point being the S-pole side threshold value and a returning (release) point being the N-pole side threshold value. A magnetic offset is defined by an average value of the operating point and the returning point. The magnetic offset is used as a measure representing the symmetric property of sensitivity between magnetic poles, and is ideally zero.

In the application for detecting an alternating magnetic field, the occurrence of a shift in the operating point or returning point increases a shift in a duty ratio or phase of an output pulse signal. The shift in the duty ratio or phase of the output pulse signal is not desired because the shift causes rotation speed fluctuations and vibrations in a brushless direct current (BLDC) motor being a main application of the alternation detection type magnetic switch.

In the bipolar detection type magnetic switch, lack of polarity control of magnets to be used in combination leads to variations in detection distance of a magnetic body detection mechanism, and may cause an offset voltage. As one of methods of eliminating an offset voltage, there is known a spinning current method. There is a proposed technology for eliminating the offset voltages of the Hall element and the amplifier in the subsequent stage through use of the spinning current method and further eliminating the asymmetric property ascribable to the offset voltage of the comparator.

However, in a technique using a two-way drive spinning current method, in some cases, a symmetric property of a magnetoelectric conversion characteristic in the magnetic switch cannot be ensured. More specifically, in the technique using the two-way drive spinning current method, when the absolute value of an offset voltage of the Hall element differs between the current drive directions, the offset voltage remains. In other words, the magnetoelectric conversion characteristic of the magnetic switch may become asymmetric.

SUMMARY

A semiconductor device according to an embodiment of the present invention includes a magnetic switch provided on a semiconductor substrate. The magnetic switch includes a Hall element, a first power supply terminal and a second power supply terminal, a drive current source, a switch circuit, an amplifier, a reference voltage circuit, a comparator, and a latch circuit. The Hall element includes at least four electrodes. The drive current source drives the Hall element. The switch circuit includes an input terminal pair supplied with a differential output voltage from two electrodes among the four electrodes, an output terminal pair, and a control terminal, and is capable of switching a connection state between the input terminal pair and the output terminal pair between a first state and a second state based on a control signal supplied to the control terminal. The amplifier amplifies a signal supplied from the output terminal pair of the switch circuit. The reference voltage circuit generates a reference voltage based on a reference common mode voltage and a control signal which are received. The comparator receives an output signal of the amplifier and the reference voltage. The latch circuit latches an output voltage of the comparator. The latch circuit performs control to switch the reference voltage of the reference voltage circuit to one of a voltage with a high adjustment value with respect to a reference value and a voltage with a low adjustment value with respect to the reference value, according to an output signal of the comparator.

According to the present invention, a symmetric property of a magnetoelectric conversion characteristic can be improved.

BRIEF DESCRIPTION OF THE DRAWINGS

FIG. 5 is a truth table illustrating an operation of the decoder according to the present embodiment.

FIG. 13 is a truth table illustrating an operation of the decoder in the semiconductor device according to the second embodiment.

DESCRIPTION OF THE EMBODIMENTS

Embodiments of the present invention provide a semiconductor device or a magnetic switch capable of improving a symmetric property of a magnetoelectric conversion characteristic. Hereinafter, a semiconductor device according to embodiments of the present invention will be described with reference to the drawings. The semiconductor device according to the embodiments includes a magnetic switch provided on a semiconductor substrate. In the description, a conversion characteristic from a magnetic flux density acting on the semiconductor substrate to an analog signal is referred to as a "magnetoelectric conversion characteristic", and a conversion characteristic from the magnetic flux density to a logic signal is referred to as a "magnetoelectric conversion switching characteristic".

First Embodiment

Figure 1:
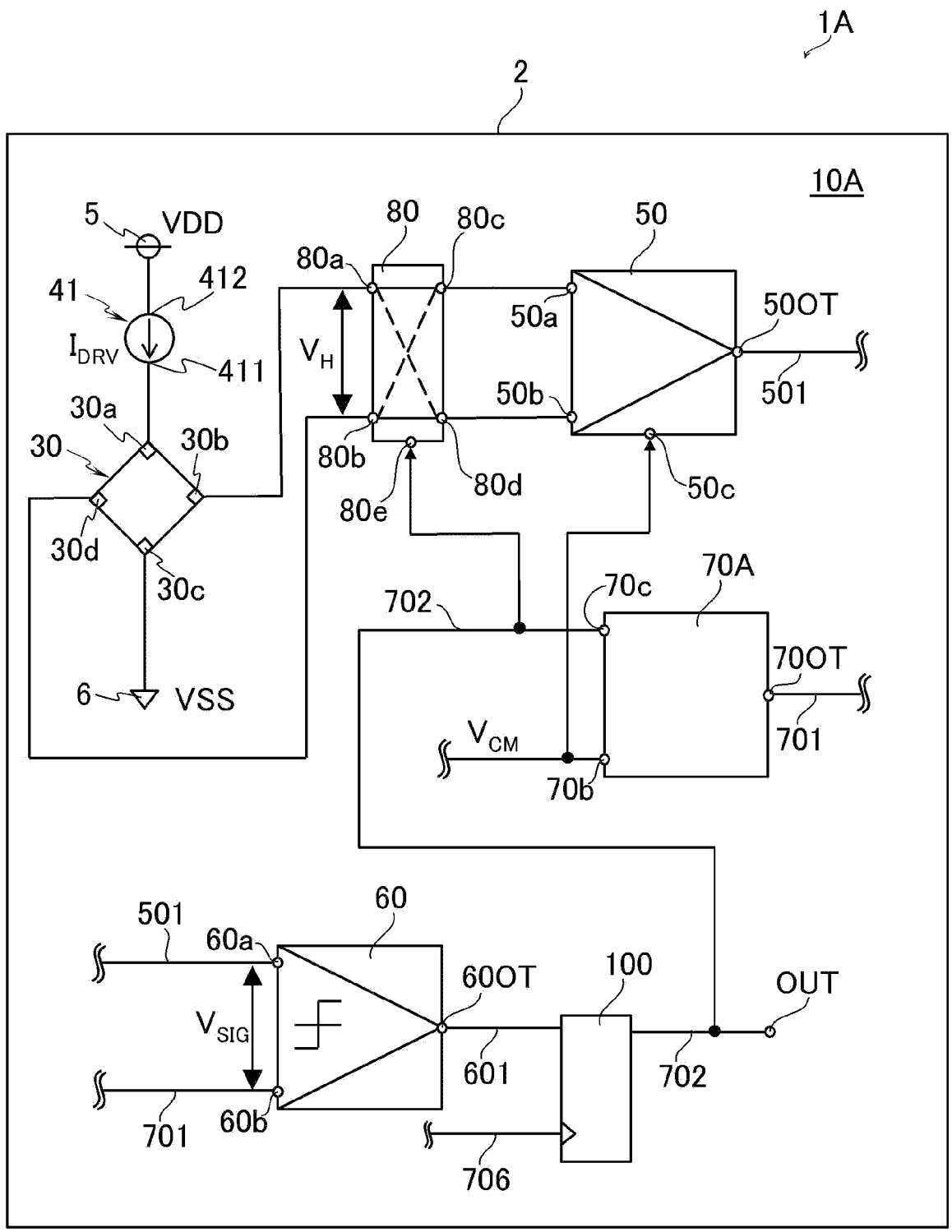
FIG. 1 is a schematic view of a semiconductor device according to a first embodiment.

FIG. 1 is a schematic view illustrating a configuration of a semiconductor device 1A according to a first embodiment.

The semiconductor device 1A includes a magnetic switch 10A provided on a semiconductor substrate 2. The magnetic switch 10A includes a first power supply terminal 5, a second power supply terminal 6, a Hall element 30, a switch circuit 80, a current source 41, an amplifier 50, a comparator 60, a reference voltage circuit 70A, and a latch circuit 100.

The Hall element 30 includes four electrodes 30a to 30d and is a magnetic detection element which obtains a differential output voltage $V_H$ corresponding to a drive current $I_{DRV}$ and a magnetic flux density $B_{in}$ perpendicular to the semiconductor substrate 2. The electrodes 30a to 30d are provided on a resistor formed of an impurity diffusion layer or a well layer of the semiconductor substrate 2 and are arranged, for example at vertices positions of a square, i.e., at diagonal positions.

The current source 41 serving as a drive current source includes a first port 411 connected to the electrode 30a and a second port 412 connected to the first power supply terminal 5 which supplies a voltage VDD. The current source 41 is configured to supply a drive current $I_{DRV}$ which is a predetermined current, so that the Hall element 30 can obtain a desired magnetoelectric conversion effect.

The switch circuit 80 is a so-called chopper switch circuit including an input terminal pair composed of input terminals 80a and 80b, an output terminal pair composed of output terminals 80c and 80d, and a control terminal 80e. The switch circuit 80 is configured to be capable of switching a connection state between the input terminal pair and the output terminal pair between a first state (straight connection state) and a second state (cross connection state) according to a logic level received at the control terminal 80e. Herein, the first state (straight connection state) is a connection state in which the differential output voltage $V_H$ received from the input terminal 80a and the input terminal 80b is respectively transmitted to the output terminal 80c and the output terminal 80d. The second state (cross connection state) is a connection state in which the differential output voltage $V_H$ received from the input terminal 80a and the input terminal 80b is respectively transmitted to the output terminal 80d and the output terminal 80c.

The amplifier 50 is formed of a differential amplifier circuit including two input terminals, i.e., a positive phase input terminal 50a and a negative phase input terminal 50b, a reference terminal 50c which receives an output reference common mode voltage, and an output terminal 50OT which amplifies and outputs a difference between the two signals received from the positive phase input terminal 50a and the negative phase input terminal 50b.

The reference voltage circuit 70A includes a control terminal 70c, a reference common mode voltage terminal 70b, and an output terminal 70OT, and is configured to output a reference voltage 701 from the output terminal 70OT according to the logic signal received at the control terminal 70c on the basis of a reference common mode voltage $V_{CM}$ received at the reference common mode voltage terminal 70b.

The comparator 60 includes a positive phase input terminal 60a which receives an amplifier output signal 501, a negative phase input terminal 60b which receives the reference voltage 701, and an output terminal 60OT. The comparator 60 is configured to compare magnitudes of the amplifier output signal 501 and the reference voltage 701 and output a binary logic signal corresponding to the comparison result as a comparator output signal 601.

The latch circuit 100 includes a signal input terminal which receives the comparator output signal 601, a clock input terminal which receives a latch clock signal 706, and an output terminal which outputs a control signal 702 as a latch output signal. The latch circuit 100 is configured to perform a so-called data latching operation. The output terminal of the latch circuit 100 is connected to an output terminal OUT of the magnetic switch 10A.

Figure 2:
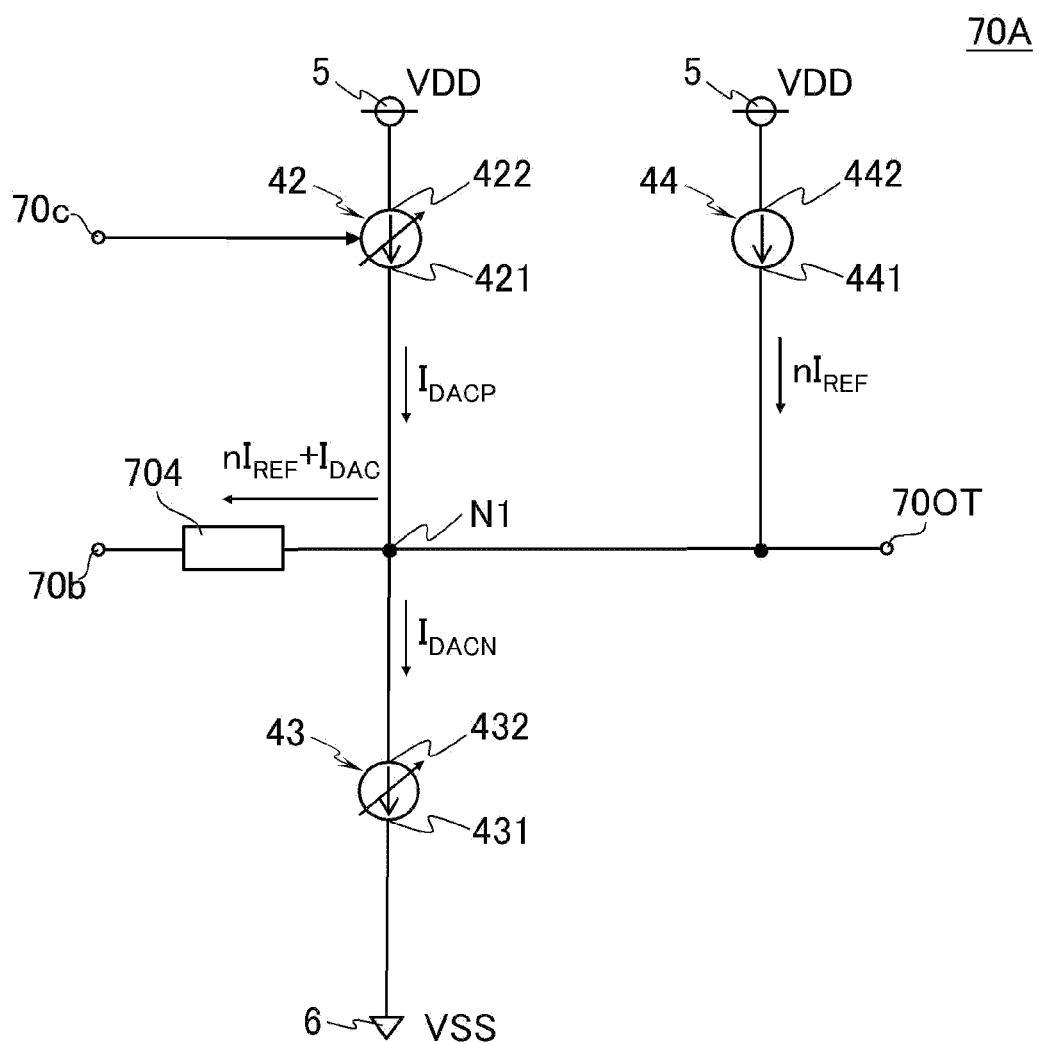
FIG. 2 is a schematic view illustrating an example of a reference voltage circuit in the semiconductor device according to the first embodiment.

FIG. 2 is a schematic view of the reference voltage circuit 70A. The configuration of the reference voltage circuit 70A will be described with reference to the drawing.

The reference voltage circuit 70A includes a first resistor 704, current sources 42, 43, and 44, an output terminal 70OT which outputs the reference voltage 701, a control terminal 70c, and a reference common mode voltage terminal 70b.

The current source 42 (specifically, a first port 421 to be described later), the current source 43 (specifically, a second port 432 to be described later), the current source 44 (specifically, a first port 441 to be described later), the first resistor 704 (specifically, "other port" to be described later), and the output terminal 70OT are connected at a node N1.

The first resistor 704 is formed of one or more resistance elements having a predetermined resistance value, and includes one port connected to the reference common mode voltage terminal 70b and the other port connected to the output terminal 70OT.

The current sources 42 and 43 are variable current sources configured to be set to continuously variable binary values and switchable to either one of the set binary values based on a control signal given to a control port. In addition to a first port 421 connected to the other port of the first resistor 704 and the output terminal 70OT and a second port 422 connected to the first power supply terminal 5, the current source 42 also includes a control port connected to the control terminal 70c.

The current source 43 includes a first port 431 connected to the second power supply terminal 6 which supplies a voltage VSS and a second port 432 connected to the node N1, and further includes a control port.

The current source 44 is configured as a constant current source which supplies a current having a predetermined intrinsic current value. The current source 44 includes a first port 441 connected to the node N1 and a second port 442 connected to the first power supply terminal 5.

The current source 42 and the current source 43 supply internally adjusted (details will be described later) current values $I_{DACP}$ and $I_{DACN}$ to the first resistor 704 according to logics of the control signal 702. The control signal 702 contains, for example, two different logics such as 0 which is low level (hereinafter referred to as "L"), and 1 which is high level (hereinafter referred to as "H"). $I_{DACP}$ is in a direction flowing into the first resistor 704, and $I_{DACN}$ is in a direction flowing out of the first resistor 704. Further, a current value $nI_{REF}$ of the current source 44 flows into the first resistor 704 regardless of the control signal 702. As a result, a current of "$nI_{REF}+I_{DACP}$" or "$nI_{REF}-I_{DACN}$" flows into the first resistor 704. Since one port of the first resistor 704 is connected to the reference common mode voltage terminal 70b, on the basis of the reference common mode voltage $V_{CM}$, the reference voltage 701 determined by a product of a resistance value of the first resistor 704 and the current of "$nI_{REF}+I_{DACP}$" or "$nI_{REF}-I_{DACN}$" is generated.

Figure 3:
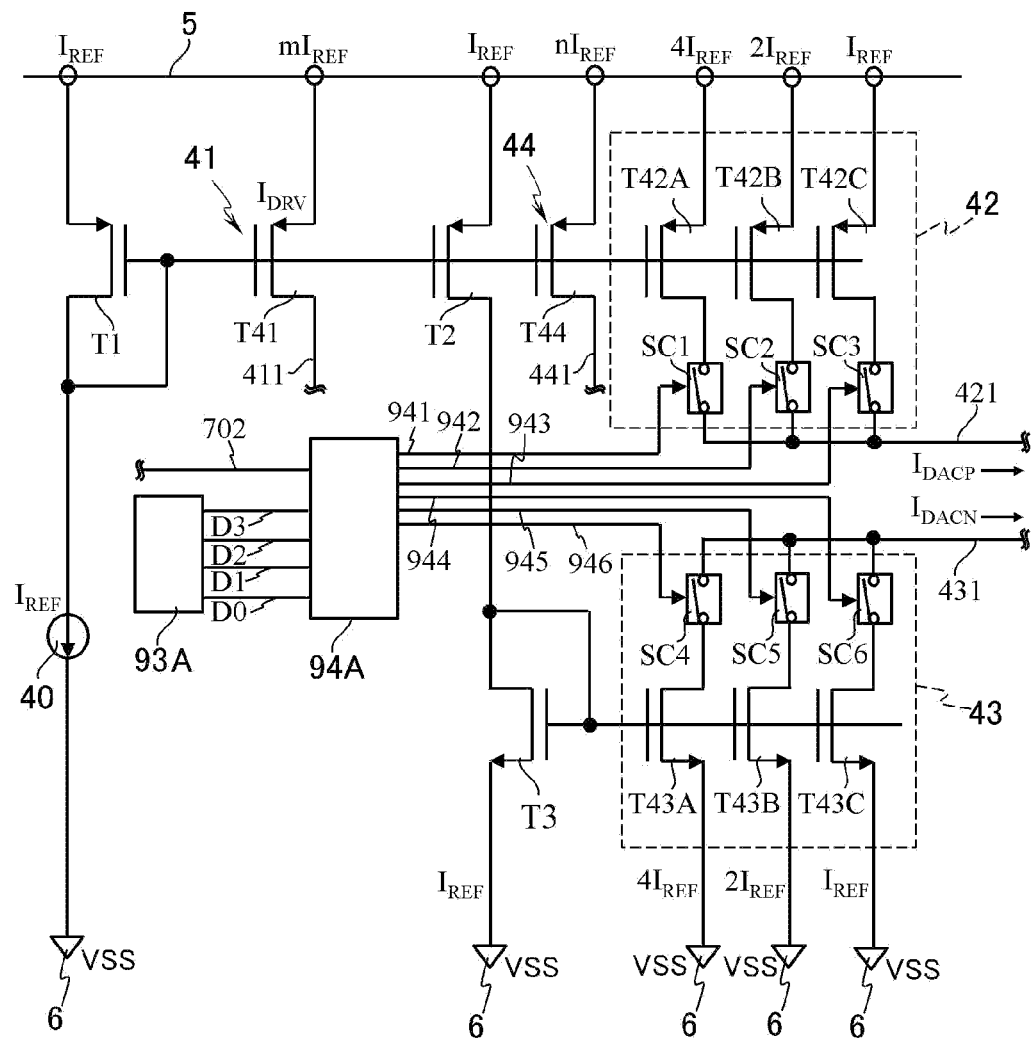
FIG. 3 is a circuit diagram illustrating a more detailed configuration example of a current source circuit in the reference voltage circuit.

FIG. 3 is circuit diagram illustrating a more detailed configuration example of the current source 41 and the current sources 42, 43, and 44 in the reference voltage circuit 70A, or specifically, a configuration example of a current source circuit including the current sources 41 to 44.

The current source circuit of FIG. 3 includes a reference current source 40 which supplies a reference current from the first power supply terminal 5 to the second power supply terminal 6, first to third transistors T1 to T3, current source transistors T41, T42A to T42C, and T43A to T43C, first to sixth current switches SC1 to SC6, a memory circuit 93A, and a decoder 94A.

The reference current source 40 is configured as a current source of a current value $I_{REF}$, and includes one port connected to the second power supply terminal 6 and the other port connected to a drain terminal and a gate terminal of the first transistor T1.

The first transistor T1 is a Pch transistor, and since the source terminal is connected to the first power supply terminal 5 and the drain terminal is commonly connected with the reference current source 40, a drain current having the current value $I_{REF}$ is flowing.

The second transistor T2 is a Pch transistor having a (W/L) ratio equal to that of the first transistor, and since the source terminal is connected to the first power supply terminal 5, the gate terminal is commonly connected with the gate terminal of the first transistor T1, the drain terminal is commonly connected with the gate terminal and the drain terminal of the third transistor T3, and a current mirror circuit is formed, a drain current having the current value $I_{REF}$ is flowing.

The third transistor T3 is an Nch transistor, and since the source terminal is commonly connected with the second power supply terminal 6, and the drain terminal is commonly connected with the drain terminal of the second transistor T2, a drain current having the current value $I_{REF}$ is flowing.

The current source transistor T41 is configured as a Pch transistor having a (W/L) ratio of m times that of the first transistor T1, and since the gate terminal is commonly connected with the gate terminal of the first transistor T1, the source terminal is connected to the first power supply terminal 5, and a current mirror circuit is formed, a drain current having a current value $mI_{REF}$ is flowing. This drain current is the drive current $I_{DRV}$ of the Hall element 30 (see FIG. 1).

The current source transistors T42A to T42C are configured as Pch transistors respectively having a (W/L) ratio of 4 times, 2 times, and 1 time that of the first transistor T1, and since the gate terminal is commonly connected with the gate terminal of the first transistor T1, the source terminal is connected to the first power supply terminal 5, and current mirror circuits are formed, the current source transistors T42A to T42C are configured to be capable of supplying drain currents respectively weighted to current values 4 $I_{REF}$, 2 $I_{REF}$, and $I_{REF}$. The drain terminals of the current source transistors T42A to T42C are respectively connected to one ports of the first to third current switches SC1 to SC3. The other ports of the first to third current switches SC1 to SC3 are commonly connected with the first port 421, and according to their open/closed state, supply of the drain currents of the current source transistors T42A to T42C to the first port 421 is controlled.

Herein, if the first to third current switches SC1 to SC3 are all in the short-circuit state, a total drain current supplied from the current source transistors T42A to T42C to the first port 421 of the current source 42 becomes 7 $I_{REF}$, and if the first to third current switches SC1 to SC3 are all in the open state, the drain current supplied from the current source transistors T42A to T42C to the first port 421 becomes zero. According to the individual open/closed state of the first to third current switches SC1 to SC3, the drain current supplied from the current source transistors T42A to T42C to the first port 421 can be controlled in the range of 0 to 7 $I_{REF}$ at the resolution of the current value $I_{REF}$.

The current source transistors T43A to T43C are configured as Nch transistors respectively having a (W/L) ratio of 4 times, 2 times, and 1 time that of the third transistor T3, and since the gate terminal is commonly connected with the gate terminal of the third transistor T3, the source terminal is connected to the second power supply terminal 6, and current mirror circuits is formed, the current source transistors T43A to T43C are configured to be capable of supplying drain currents respectively weighted to current values 4 $I_{REF}$, 2 $I_{REF}$, and $I_{REF}$. The drain terminals of the current source transistors T43A to T43C are respectively connected to one ports of the fourth to sixth current switches SC4 to SC6. The other ports of the fourth to sixth current switches SC4 to SC6 are commonly connected with the first port 431 of the current source 43, and according to their open/closed state, supply of the drain currents of the current source transistors T43A to T43C to the first port 431 is controlled.

Herein, if the fourth to sixth current switches SC4 to SC6 are all in the short-circuit state, a total drain current supplied from the current source transistors T43A to T43C to the first port 431 becomes $-7\ I_{REF}$, and if the fourth to sixth current switches SC4 to SC6 are all in the open state, the drain current supplied from the current source transistors T43A to T43C to the first port 431 becomes zero. According to the individual open/closed state of the fourth to sixth current switches SC4 to SC6, the drain current supplied from the current source transistors T43A to T43C to the first port 431 of the current source 43 can be controlled in the range of $-7\ I_{REF}$ to 0 at the resolution of the current value $I_{REF}$.

The current source transistor T44 is configured as a Pch transistor having a (W/L) ratio of n times that of the first transistor T1, and since the gate terminal is commonly connected with the gate terminal of the first transistor T1, the source terminal is connected to the first power supply terminal 5, and a current mirror circuit is formed, a drain current having a current value $nI_{REF}$ is flowing. This drain current is the current which constantly drives the first resistor 704 regardless of the state of the control signal 702 (see FIG. 2).

The memory circuit 93A is configured as a 4-bit non-volatile memory such as a fuse ROM or an EEPROM, and outputs binary signals D0 to D3 connected to the decoder 94A. The binary signals D0 to D3 are set in advance in the manufacturing process based on a binary adjustment code BinCode defined according to a current adjustment amount required for adjusting the magnetoelectric conversion characteristic.

The decoder 94A receives the control signal 702 and the binary signals D3 to D0, and outputs binary control signals 941 to 946 of the first to sixth current switches SC1 to SC6 according to these binary signals. When the binary control signals 941 to 946 are "1", the corresponding first to sixth current switches SC1 to SC6 are turned on, and the drain currents of the current source transistors T42A to T42C and the current source transistors T43A to T43C respectively flow to the first port 421 of the current source 42 and the first port 431 of the current source 43. When the binary control signals 941 to 946 are "0" (zero), the corresponding first to sixth current switches SC1 to SC6 are turned off, and the drain currents of the current source transistors T42A to T42C and the current source transistors T43A to T43C are cut off, respectively.

Figure 4:
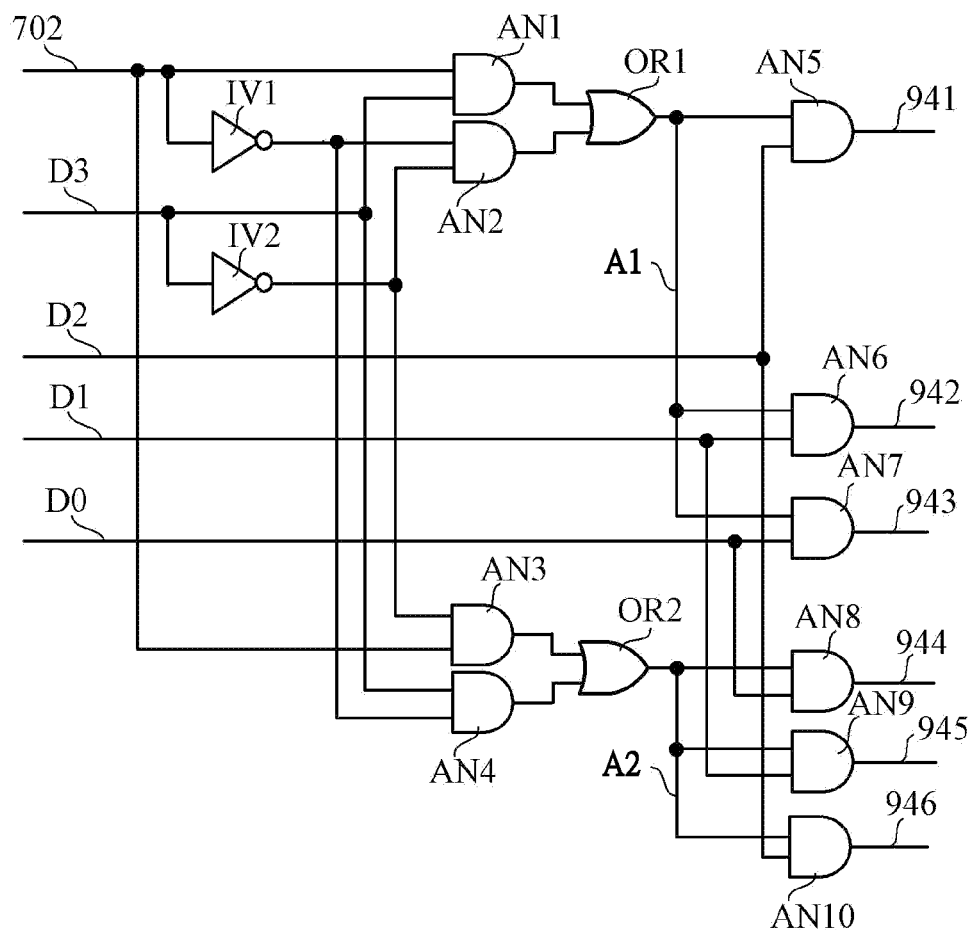
FIG. 4 is a circuit diagram illustrating a configuration example of a decoder according to the present embodiment.

FIG. 4 is an example of a detailed configuration of the decoder 94A, and FIG. 5 is a truth table of the decoder 94A. A detailed configuration example of the decoder 94A will be described with reference to FIG. 4.

The decoder 94A includes various logic gates IV1 to IV2, AN1 to AN10, and OR1 to OR2, and is configured to enable the binary signals D2 to D0 (absolute value bits) by combinatory logic signals A1 and A2 of the control signal 702 and the binary signal D3 (polarity bit) to output to the binary control signals 941 to 946. More specifically, the binary control signals 941 to 946 of the first to sixth current switches SC1 to SC6 are outputted according to the truth table as illustrated in FIG. 5.

As illustrated in the truth table of FIG. 5, according to the code of the control signal 702, assignment of the binary control signals 941 to 946 with respect to the binary signal D [3:0] is switched, and the code of $I_{DAC}$ with respect to the binary signal D [3:0] is reversed. In this example, D [3:0]=0000b and D [3:0]=1000b correspond to 0 (zero), i.e., a case where an adjustment value is 0 or a magnetic offset adjustment is not performed.

Subsequently, the operation of the semiconductor device 1A will be described.

Figure 6:
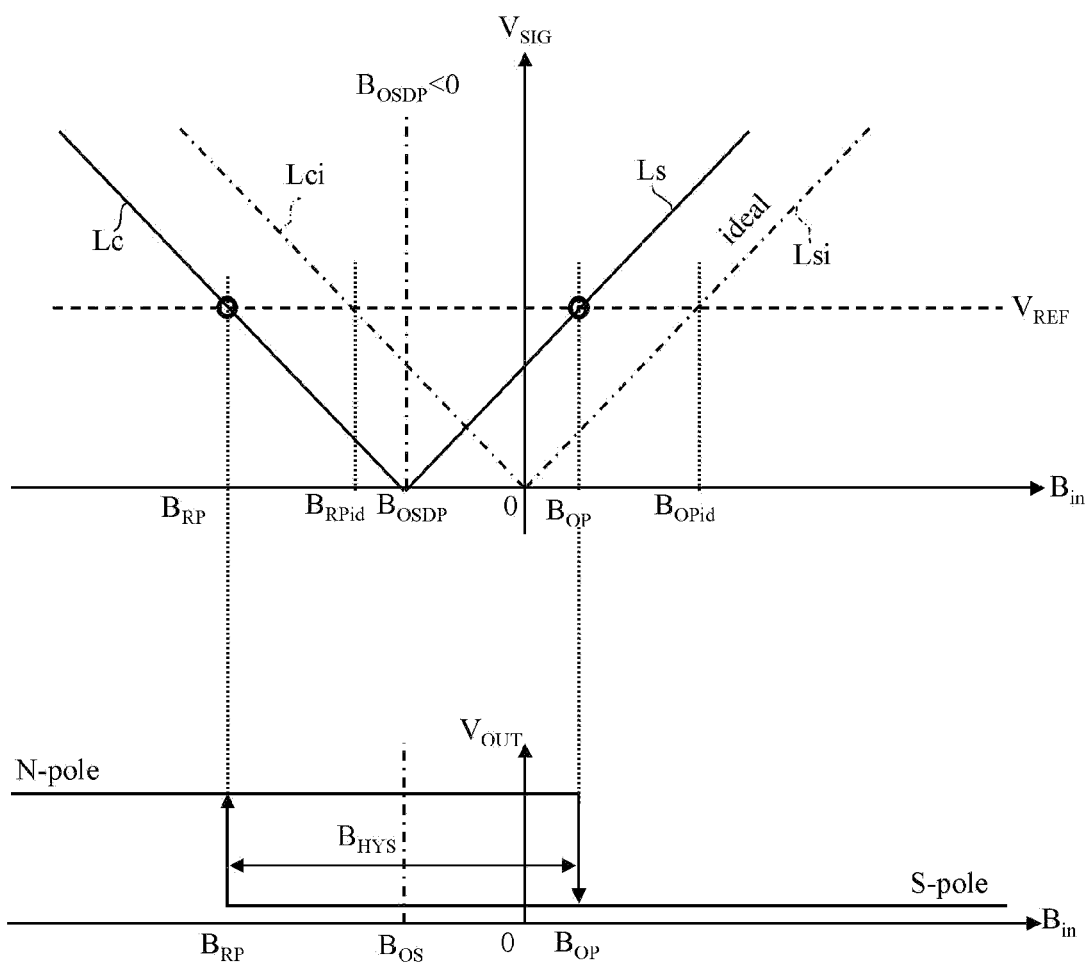
FIG. 6 is a view illustrating a magnetoelectric conversion characteristic when a magnetic offset of a Hall element is negative ($B_{OS}<0$) and there is no adjustment in the semiconductor device according to the present embodiment.
Figure 7:
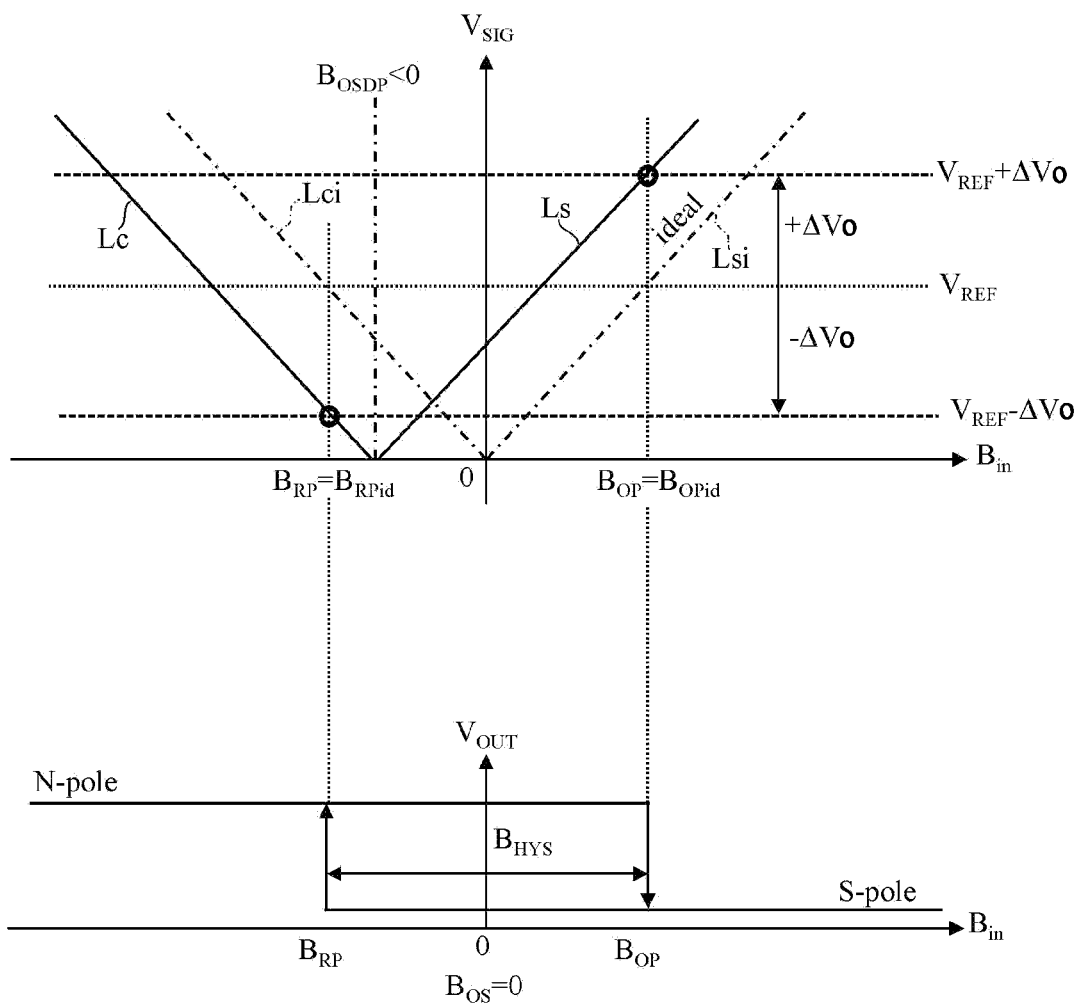
FIG. 7 is a view illustrating a magnetoelectric conversion characteristic when a magnetic offset of the Hall element is negative ($B_{OS}<0$) and adjustment is performed in the semiconductor device according to the present embodiment.

FIG. 6 and FIG. 7 are views illustrating the magnetoelectric conversion characteristic of the semiconductor device 1A when the magnetic offset of the Hall element 30 is negative. FIG. 6 illustrates the magnetoelectric conversion characteristic when there is no adjustment, and FIG. 7 illustrates the magnetoelectric conversion characteristic when the semiconductor device of the present embodiment is optimally adjusted.

In FIG. 6 and FIG. 7, the horizontal axis represents a magnetic flux density $B_{in}$ applied to a detection axis of the semiconductor device 1A, and the vertical axis respectively represents a voltage $V_{SIG}$ which is a differential input voltage of the comparator 60 and a voltage $V_{OUT}$ which is an output voltage of the comparator 60. Herein, broken straight lines Lsi and Lci represent the magnetoelectric conversion characteristic when the Hall element 30 has an ideal magnetoelectric conversion characteristic. Solid straight lines Ls and Lc represent the magnetoelectric conversion characteristic when the Hall element 30 has a negative magnetic offset $B_{OS}$. The straight lines Ls and Lsi represent the magnetoelectric conversion characteristic when the switch circuit 80 is in the first state (straight connection state). The straight lines Lc and Lci represent the magnetoelectric conversion characteristic when the switch circuit 80 is in the second state (cross connection state). A hysteresis width $B_{HYS}$ represents a difference between a magnetic flux density $B_{OP}$ which is an S-pole side threshold value defined as an operation point and a magnetic flux density $B_{RP}$ which is an N-pole side threshold value defined as a returning point.

An operation (FIG. 6) in the case where there is no adjustment (adjustment not performed) will be described. In the case where the Hall element 30 has the ideal magnetoelectric conversion characteristic, since the switch circuit 80 is in the first state (straight connection state) when the N-pole magnetic field is detected, a magnetoelectric conversion characteristic along the straight line Lsi is exhibited, and since the switch circuit 80 is in the second state (cross connection state) when the S-pole magnetic field is detected, a magnetoelectric conversion characteristic along the straight line Lci is exhibited.

On the other hand, in the case where the Hall element 30 has the negative magnetic offset $B_{OS}$, since the switch circuit 80 is in the first state (straight connection state) when the N-pole magnetic field is detected, a magnetoelectric conversion characteristic along the straight line Ls, which is obtained after negatively translating the straight line Lsi by $B_{OS}$, is exhibited, and since the switch circuit 80 is in the second state (cross connection state) when the S-pole magnetic field is detected, a magnetoelectric conversion characteristic along the straight line Lc, which is obtained after negatively translating the straight line Lci by $B_{OS}$, is exhibited.

When the Hall element 30 has the ideal magnetoelectric conversion characteristic, an S-pole intense magnetic field is detected at an intersection of the straight line Lsi and the reference value $V_{REF}$ of the reference voltage (hereinafter also referred to as a "comparator reference voltage") supplied from the comparator 60, and an N-pole intense magnetic field is detected at an intersection of the straight line Lci and the reference value $V_{REF}$. Magnetic flux densities $B_{OPid}$ and $B_{RPid}$ corresponding to the respective intersections indicate the ideal operating point and returning point. On the other hand, when the Hall element 30 has a negative magnetic offset $B_{OSDP}$, since the respective intersections also translate negatively by $B_{OSDP}$ in a similar manner as the straight lines Ls and Lc, magnetic flux densities $B_{OP}$ and $B_{RP}$ corresponding to the respective intersections become the operating point and the returning point. The relationship among $B_{OPid}$, $B_{RPid}$, $B_{OP}$, $B_{RP}$, and $B_{OSDP}$ is expressed by Formula (1) and Formula (2) below.

$$B_{OP}=B_{OPid}-|B_{OSDP}| \tag{1}$$

$$B_{RP}=B_{RPid}-|B_{OSDP}| \tag{2}$$

Subsequently, an operation (FIG. 7) when an adjustment is performed will be described. The difference from FIG. 6 lies in that the comparator reference voltage supplied from the comparator 60 is switchable between a comparator reference voltage $V_{REF}+\Delta Vo$ obtained by applying an adjustment value $\Delta Vo$ ($\Delta Vo>0$) of the reference voltage to the reference value $V_{REF}$ in the positive direction, and a comparator reference voltage $V_{REF}-\Delta Vo$ obtained by applying $\Delta Vo$ to the reference value $V_{REF}$ in the negative direction. The reference voltage $V_{REF}$ is the same as in FIG. 6, and the comparator reference voltages $V_{REF}+\Delta Vo$ and $V_{REF}-\Delta Vo$ are voltages obtained by respectively translating from the reference voltage $V_{REF}$ by the adjustment value $\Delta Vo$ in the positive and negative directions. Since the straight lines Ls, Lsi, Lc, and Lci representing the magnetoelectric conversion characteristics are the same as those in FIG. 6, descriptions thereof will be omitted.

In FIG. 7, in the case where the Hall element 30 has the ideal magnetoelectric conversion characteristic, the S-pole magnetic field is detected at the intersection of the straight line Ls and the comparator reference voltage $V_{REF}+\times Vo$, and the N-pole magnetic field is detected at the intersection of the straight line Lc and the comparator reference voltage $V_{REF}-\Delta Vo$. If $\Delta Vo$ is set to an appropriate value, the operating point $B_{OP}$ indicated by the intersection of the straight line Ls and the comparator reference voltage $V_{REF}+\times Vo$ can coincide with the ideal operating point $B_{OPid}$, and the returning point $B_{RP}$ indicated by the intersection of the straight line Lc and the comparator reference voltage $V_{REF}-\times Vo$ can coincide with the ideal returning point $B_{RPid}$.

Figure 8:
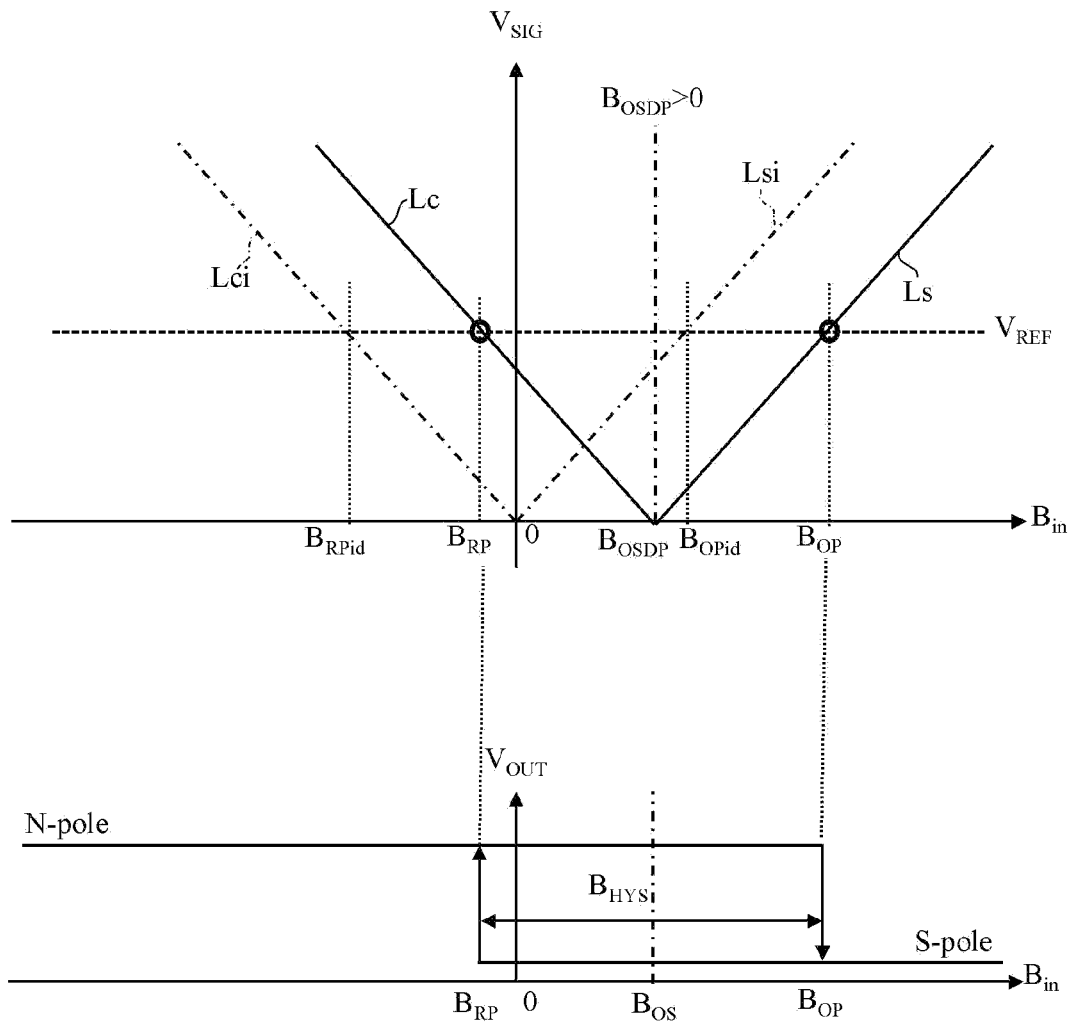
FIG. 8 is a view illustrating a magnetoelectric conversion characteristic when a magnetic offset of the Hall element is positive ($B_{OS}>0$) and there is no adjustment in the semiconductor device according to the present embodiment.
Figure 9:
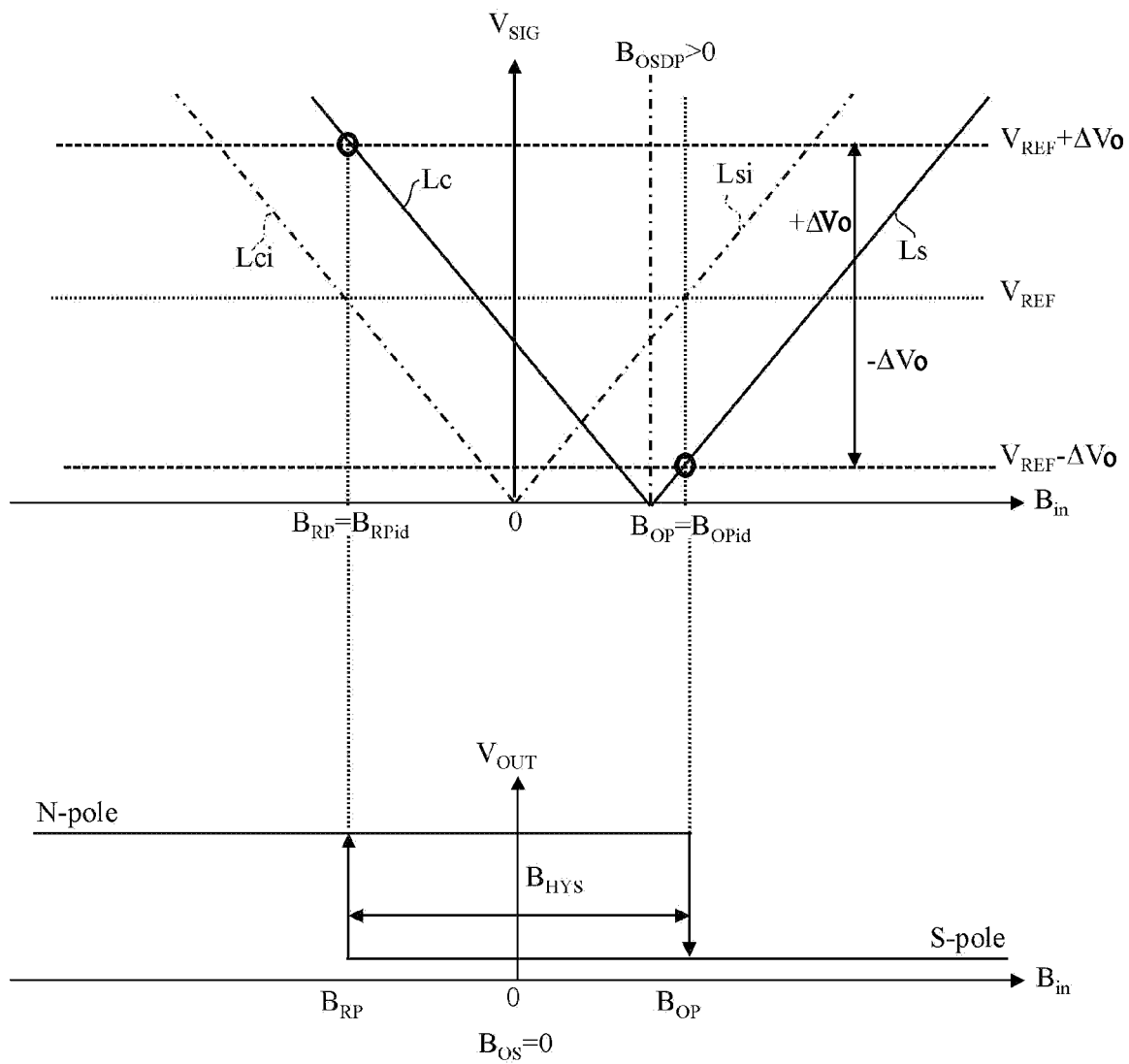
FIG. 9 is a view illustrating a magnetoelectric conversion characteristic when a magnetic offset of the Hall element is positive ($B_{OS}>0$) and adjustment is performed in the semiconductor device according to the present embodiment.

FIG. 8 and FIG. 9 are views illustrating the magnetoelectric conversion characteristic of the semiconductor device 1A when the magnetic offset of the Hall element 30 is positive. FIG. 8 illustrates the magnetoelectric conversion characteristic when there is no adjustment, and FIG. 9 illustrates the magnetoelectric conversion characteristic when an optimal adjustment is applied in the present embodiment.

In FIG. 8 and FIG. 9, the broken straight lines Lsi and Lci are the same as the broken straight lines Lsi and Lci illustrated in FIG. 6 and FIG. 7. On the other hand, the solid straight lines Ls and Lc illustrated in FIG. 8 and FIG. 9 are similar to the solid straight lines Ls and Lc illustrated in FIG. 6 and FIG. 7 except that the solid straight lines Ls and Lc illustrated in FIG. 8 and FIG. 9 represent the magnetoelectric conversion characteristics when the Hall element 30 has a positive magnetic offset $B_{OS}$. In other words, the straight line Ls represents a magnetoelectric conversion characteristic when the switch circuit 80 is in the first state (straight connection state). The straight line Lc represents a magnetoelectric conversion characteristic when the switch circuit 80 is in the second state (cross connection state).

In FIG. 8 and FIG. 9, the horizontal axis and the vertical axis are the same as those in FIG. 6, so descriptions thereof will be omitted. First, an operation (FIG. 8) in the case where there is no adjustment (adjustment not performed) will be described. In the case where the Hall element 30 has the ideal magnetoelectric conversion characteristic, since the switch circuit 80 is in the first state (straight connection state) when the N-pole magnetic field is detected, a magnetoelectric conversion characteristic along the straight line Lsi is exhibited, and since the switch circuit 80 is in the second state (cross connection state) when the S-pole magnetic field is detected, a magnetoelectric conversion characteristic along the straight line Lci is exhibited.

On the other hand, in the case where the Hall element 30 has a positive magnetic offset $B_{OSDP}$, since the switch circuit 80 is in the first state (straight connection state) when the N-pole magnetic field is detected, a magnetoelectric conversion characteristic along the straight line Ls, which is obtained after positively translating the straight line Lsi by $B_{OSDP}$, is exhibited, and since the switch circuit 80 is in the second state (cross connection state) when the S-pole magnetic field is detected, a magnetoelectric conversion characteristic along the straight line Lc, which is obtained by positively translating the straight line Lci by $B_{OSDP}$, is exhibited.

The descriptions of the case where the Hall element 30 has the ideal magnetoelectric conversion characteristic repeat descriptions of FIG. 6 and will be omitted. When the Hall element 30 has a positive magnetic offset $B_{OSDP}$, since the respective intersections also translate positively by $B_{OSDP}$ in the same manner as the straight lines Ls and Lc, magnetic flux densities $B_{OP}$ and $B_{RP}$ corresponding to the respective intersections become the operating point and the returning point. The relationship among $B_{OPid}$, $B_{RPid}$, $B_{OP}$, $B_{RP}$, and $B_{OSDP}$ is expressed by Formula (3) and Formula (4) below.

$$B_{OP}=B_{OPid}+B_{OSDP} \tag{3}$$

$$B_{RP}=B_{RPid}+B_{OSDP} \tag{4}$$

Subsequently, an operation (FIG. 9) when an adjustment is performed will be described. The difference from FIG. 8 lies in that the comparator reference voltage is switchable between $V_{REF}+\Delta Vo$ and $V_{REF}-\Delta Vo$. Since the straight lines Ls, Lsi, Lc, and Lci are the same as those in FIG. 8, descriptions thereof will be omitted. In FIG. 9, when the Hall element 30 has the ideal magnetoelectric conversion characteristic, an S-pole intense magnetic field is detected at the intersection of the straight line Ls and the comparator reference voltage $V_{REF}-\Delta Vo$, and an N-pole intense magnetic field is detected at the intersection of the straight line Lc and the comparator reference voltage $V_{REF}+\Delta Vo$. If the adjustment value $\Delta Vo$ is set to an appropriate value, the operating point indicated by the intersection of the straight line Ls and the comparator reference voltage $V_{REF}-\Delta Vo$ can coincide with the magnetic flux density $B_{OPid}$ which is the ideal operating point, and the returning point indicated by the intersection of the straight line Lc and the comparator reference voltage $V_{REF}+\Delta Vo$ can coincide with the magnetic flux density $B_{RPid}$ which is the ideal returning point.

Figure 10:
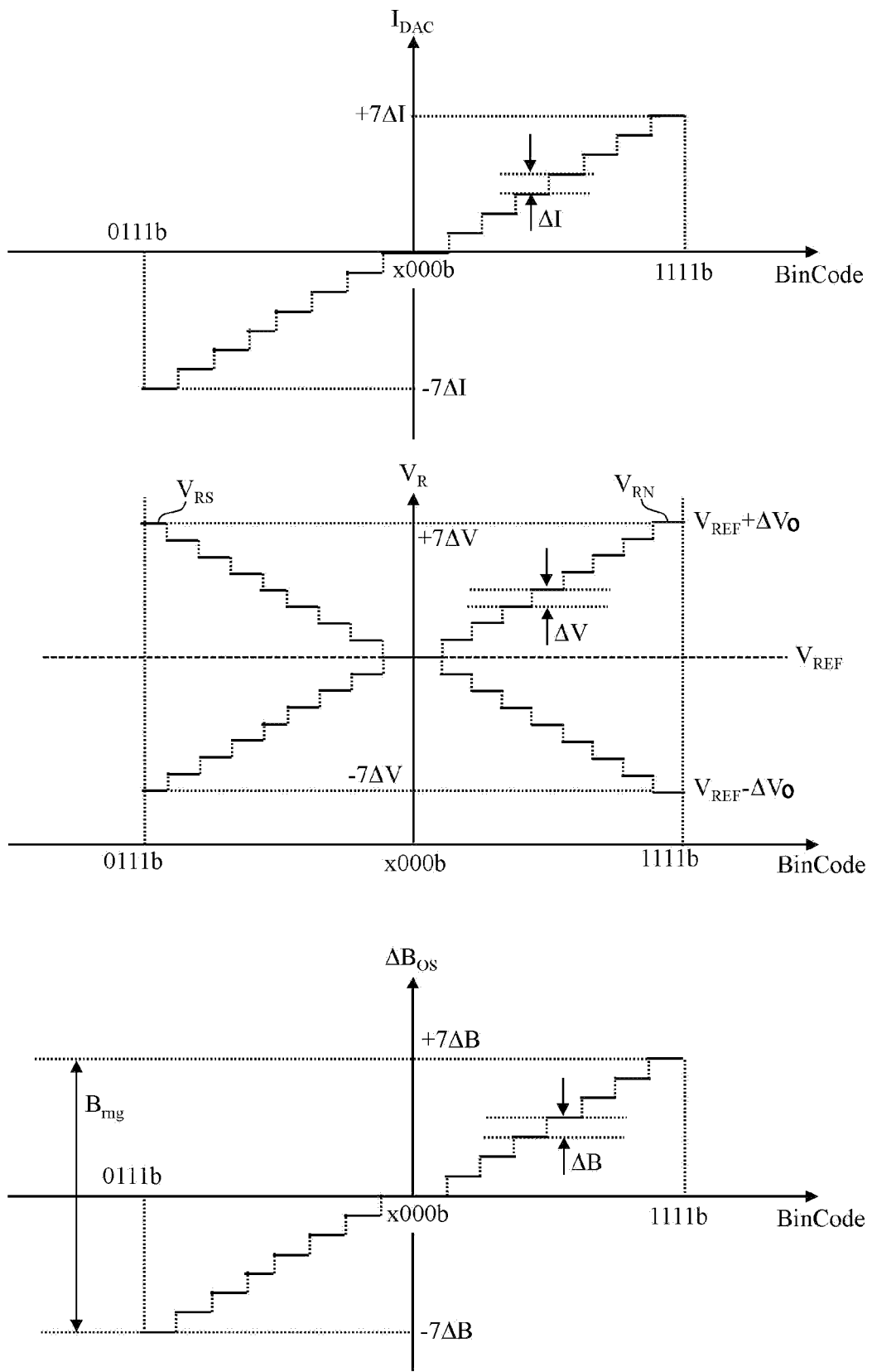
FIG. 10 is a schematic view illustrating a relationship between a control signal, an adjusting current, a comparator reference voltage, and a magnetic offset in the semiconductor device according to the first embodiment.

Subsequently, the principle of the magnetic offset adjustment of the present embodiment will be described with reference to the drawing. FIG. 10 illustrates an example of a reference current $I_{DAC}$, a comparator reference voltage $V_R$, and a magnetic offset adjustment amount $\Delta B_{OS}$ with respect to a 4-bit (3 bits in the positive and negative each) binary adjustment code BinCode, i.e., a binary adjustment code BinCode having an adjustment bit number N (design constant)=4 (to be described later). Herein, a polygonal line $V_{RN}$ illustrated in the chart (the middle chart of the three charts illustrated in FIG. 10) of the comparator reference voltage $V_R$ with respect to the binary adjustment code BinCode illustrates the case where the N-pole magnetic field is detected, i.e., the case where the code of the control signal 702 is L. The polygonal line $V_{RS}$ illustrates the case where the S-pole magnetic field is detected, i.e., the case where the code of the control signal 702 is H.

There area total of 16 binary adjustment codes BinCode including 0000b to 1111b, with the MSB corresponding to a code of the adjustment value ΔVo and the lower-order bits corresponding to an absolute value of the adjustment value ΔVo. Here, an adjustment resolution of the reference current $I_{DAC}$ is defined as "current adjustment resolution ΔI", the reference current $I_{DAC}$ is configured to become $I_{DAC}$=−7 ΔI when D [3:0]=0111b, and become $I_{DAC}$=+7 ΔI when D [3:0]=1111b. Similarly, in the case where the N-pole magnetic field is detected, and where an adjustment resolution of the comparator reference voltage $V_R$ is defined as "voltage adjustment resolution ΔV", the comparator reference voltage $V_R$ is configured to become $V_R$=$V_{REF}$−ΔVo=$V_{REF}$−7 ΔV when D [3:0]=0111b, and become $V_R$=$V_{REF}$+ΔVo=$V_{REF}$+7 ΔV when D [3:0]=1111b (see the polygonal line $V_{RN}$). In the case where the S-pole magnetic field is detected, the comparator reference voltage $V_R$ is configured to become $V_R$=$V_{REF}$+ΔVo=$V_{REF}$+7 ΔV when D [3:0]=0111b, and become $V_R$=$V_{REF}$−ΔVo=$V_{REF}$+7 ΔV when D [3:0]=1111b (see the polygonal line $V_{RS}$), by using the voltage adjustment resolution ΔV.

As a result, the magnetic offset adjustment amount $\Delta B_{OS}$ becomes $\Delta B_{OS}$=−7 ΔB when D [3:0]=0111b, and becomes $\Delta B_{OS}$=+7 ΔB when D [3:0]=1111b. Using the current adjustment resolution ΔI (design constant) of the reference current $I_{DAC}$, a resistance value $R_{REF}$ (design constant) of the first resistor 704, a magnetoelectric conversion coefficient $K_H$ of the Hall element, and a gain G of the amplifier 50, a magnetic offset adjustment resolution ΔB is expressed by Formula (5) below.

$$\Delta B = \Delta V/(K_H \times G) = (R_{REF} \times \Delta I)/(K_H \times G) \quad (5)$$

Further, an adjustment range $B_{rng}$ of the magnetic offset is expressed by Formula (6) below using the magnetic offset adjustment resolution ΔB and the adjustment bit number N (design constant).

$$B_{rng} = \Delta B \times 2^{\wedge}(N-1) \quad (6)$$

Herein, 2^(N−1) represents 2 to the (N−1)th power.

In this manner, the magnetic offset adjustment resolution ΔB and the adjustment range $B_{rng}$ can be controlled in consideration of the variation range of the magnetic offset of the Hall element 30 and the accuracy required for the magnetic switch according to the design constant.

According to the present embodiment, by switching the comparator reference voltage $V_R$ for determining the magnetic flux density $B_{OP}$ which is the operating point and the magnetic flux density $B_{RP}$ which is the returning point according to the control signal 702 corresponding to the output level of the comparator 60, it is possible to correct the influence of the magnetic offset $B_{OSDP}$ of the Hall element 30 on the operating point and the returning point. In other words, according to the present embodiment, it is possible to obtain a magnetoelectric conversion switching characteristic capable of suppressing the influence of the magnetic offset $B_{OSDP}$ of the Hall element 30.

According to the present embodiment, it is possible to optimize the operating point and the returning point by an adjustment work in advance. For example, when the magnetic offset $B_{OS}$ can be measured in an inspection process, according to the measured initial value of $B_{OS}$, the binary signal D [3:0] may be set to adjust the current values of the current sources 42 and 43 to optimum current values so that the adjusted $B_{OS}$ approaches zero. Further, when the magnetic offset $B_{OS}$ has a systematic bias, the binary signal D [3:0] may be set to adjust the current values of the current sources 42 and 43 to the optimum current values so that the adjusted magnetic offset $B_{OS}$ approaches zero.

In the first embodiment described above, the current sources 42 and 43 are configured to be adjustable by 3 bits in the positive and negative each; however, they may also be configured with any adjustment bit number N. In this case, it is possible to obtain an adjustment range and an adjustment resolution of the magnetic offset $B_{OS}$ corresponding to the adjustment bit number N.

Second Embodiment

Next, a second embodiment will be described with reference to the drawings, focusing on the differences from the first embodiment.

A semiconductor device 1B according to the second embodiment is similar to the semiconductor device 1A illustrated in FIG. 1 except that the semiconductor device 1B includes a reference voltage circuit 70B in place of the reference voltage circuit 70A. In other words, if the reference numerals 1A and 70A labeled in FIG. 1 are respectively read as 1B and 70B, it becomes a schematic view illustrating the configuration of the semiconductor device 1B. Thus, in the present embodiment, the reference voltage circuit 70B will be mainly described, and repeating descriptions of the semiconductor device 1A will be omitted.

Figure 11:
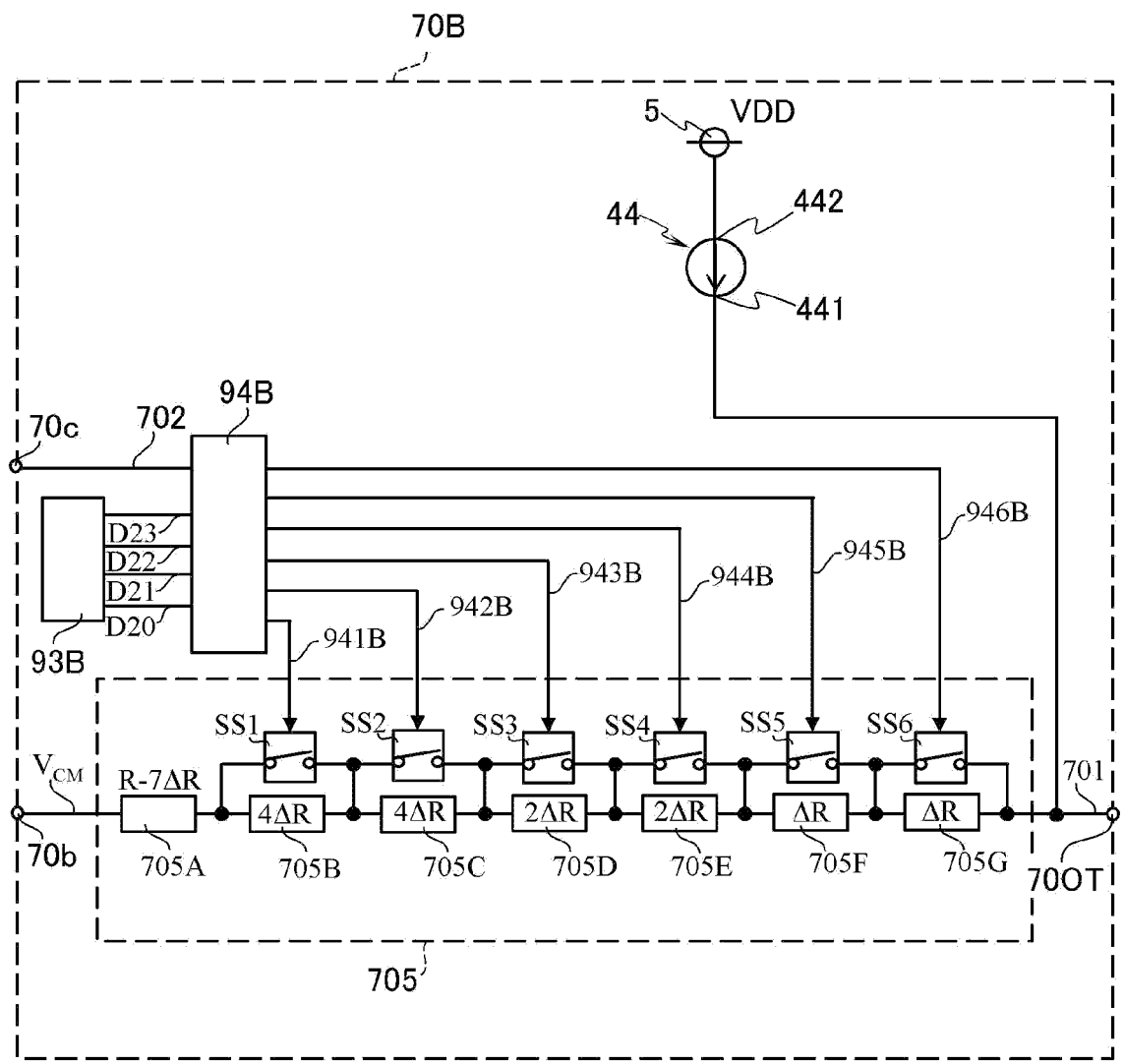
FIG. 11 is a circuit diagram illustrating an example of a reference voltage circuit in a semiconductor device according to a second embodiment.

FIG. 11 is a circuit diagram illustrating a configuration of the reference voltage circuit 70B in the semiconductor device 1B.

The reference voltage circuit 70B includes a memory circuit 93B, a decoder 94B, a second resistor 705 composed of first to seventh resistance segments 705A to 705G, a current source 44, and first to sixth short-circuit switches SS1 to SS6.

The second resistor 705 is formed of the first to seventh resistance segments 705A to 705G connected in series, and includes one port connected to the reference common mode voltage terminal 70b and the other port connected to the reference voltage 701.

The first short-circuit switch SS1 is connected to two ports of the second resistance segment 705B, the second short-circuit switch SS2 is connected to two ports of the third resistance segment 705C, the third short-circuit switch SS3 is connected to two ports of the fourth resistance segment 705D, the fourth short-circuit switch SS4 is connected to two ports of the fifth resistance segment 705E, the fifth short-circuit switch SS5 is connected to two ports of the sixth resistance segment 705F, and the sixth short-circuit switch SS6 is connected to two ports of the seventh resistance segment 705G. The resistance values of the first to sixth short-circuit switches SS1 to SS6 in the closed state (turned-on state) are sufficiently smaller than the resistance values of the first to seventh resistance segments 705A to 705G, and according to their open/closed state, switching control is performed to enable or disable each of the first to seventh resistance segments 705A to 705G connected in parallel.

The first resistance segment 705A is a reference resistor for defining a resistance value of the second resistor 705 when the first to sixth short-circuit switches SS1 to SS6 are all in the short-circuit state, and its resistance value is set to be, for example, R−7 ΔR. The second to seventh resistance segments 705B to 705G are weighted resistors. For example, the second to third resistance segments 705B to 705C are configured to be 4 ΔR, the fourth to fifth resistance segments 705D to 705E are configured to be 2 ΔR, and the sixth to seventh resistance segments 705F to 705G are configured to be ΔR. In that case, when the first to sixth short-circuit switches SS1 to SS6 are all in the open state (turned-off state), the resistance value of the second resistor 705 is R+7 ΔR. In this manner, according to the state of the first to sixth short-circuit switches SS1 to SS6, the resistance value of the second resistor 705 may be arbitrarily set by control signals 941B to 946B to a resistance value in ΔR increments between a minimum value R−7 ΔR and a maximum value R+7 ΔR.

The current source 44 includes a first port 441 connected to the reference voltage 701 and a second port 442 connected to the first power supply terminal. As in the reference voltage circuit 70A, the current source 44 does not require switching control, and a current value $I_{REF}$ of its output current may be a fixed value.

Similar to the memory circuit 93A, the memory circuit 93B outputs 4-bit signals D20 to D23 constituting a binary adjustment code BinCode to the decoder 94B.

According to the control signal 702 and the 4-bit signals D20 to D23, the decoder 94B outputs control signals 941B to 946B to a signal line for controlling the open/closed state of the first to sixth short-circuit switches SS1 to SS6. The signal D20 represents the LSB (least significant bit) of the binary adjustment code BinCode, and the signal D23 represents the MSB (most significant bit) of the binary adjustment code BinCode.

Next, an operation of the reference voltage circuit 70B will be described. The current value $I_{REF}$ of the reference current injected into the second resistor 705 having the resistance value R±ΔnR (n is an integer of 0 to 7) generates a comparator reference voltage $V_R$ represented by Formula (7) below.

$$V_R = V_{CM}(R \pm n\Delta R) \times I_{REF} \quad (7)$$

n=0 when the adjustment code is D [3:0]=0000b and D [3:0]=1000b, n=−1 when the adjustment code is D [3:0] =0001b, n=−7 when the adjustment code is D [3:0]=0111b, n=+1 when the adjustment code is D [3:0]=1001b, and n=+7 when the adjustment code is D [3:0]=1111b. According to the above example, it is possible to generate a comparator reference voltage $V_R$ of $V_{REF} \pm n\Delta V$ which changes stepwise according to the adjustment code.

Figure 12:
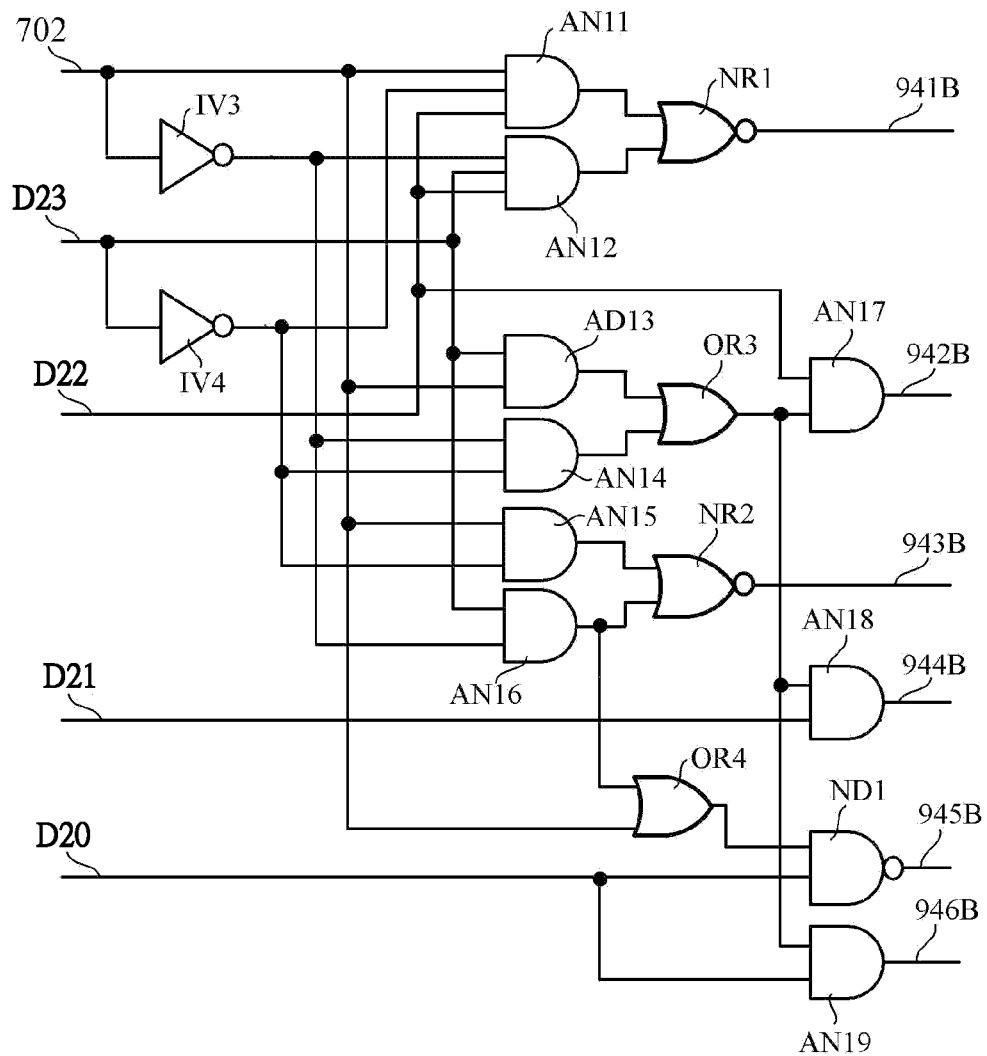
FIG. 12 is a circuit diagram illustrating a configuration of a decoder in the semiconductor device according to the second embodiment.

FIG. 12 is a circuit diagram illustrating an example of a detailed configuration of the decoder 94B. FIG. 13 is a truth table illustrating the operation of the decoder 94B.

A configuration example of the decoder 94B will be described with reference to FIG. 12. The decoder 94B includes various logic gates IV3 to IV4, AN11 to AN19, OR3 to OR4, NR1 to NR2, and ND1, and is configured to decode the control signal 702 and the binary signals D23 to D20 to output to the binary control signals 941B to 946B. More specifically, the control signals 941B to 946B indicating the open/closed state of the first to sixth short-circuit switches SS1 to SS6 are outputted according to the truth table as illustrated in FIG. 13. As illustrated in the truth table of FIG. 13, according to the code of the control signal 702, assignment of the binary control signals 941B to 946B with respect to the binary signal D [3:0] is switched, and a code of a deviation (±nΔR) from a center value R of $R_{DAC}$ with respect to the binary signal D [3:0] is reversed.

Subsequently, the magnetic offset adjustment of the present embodiment will be described.

Figure 14:
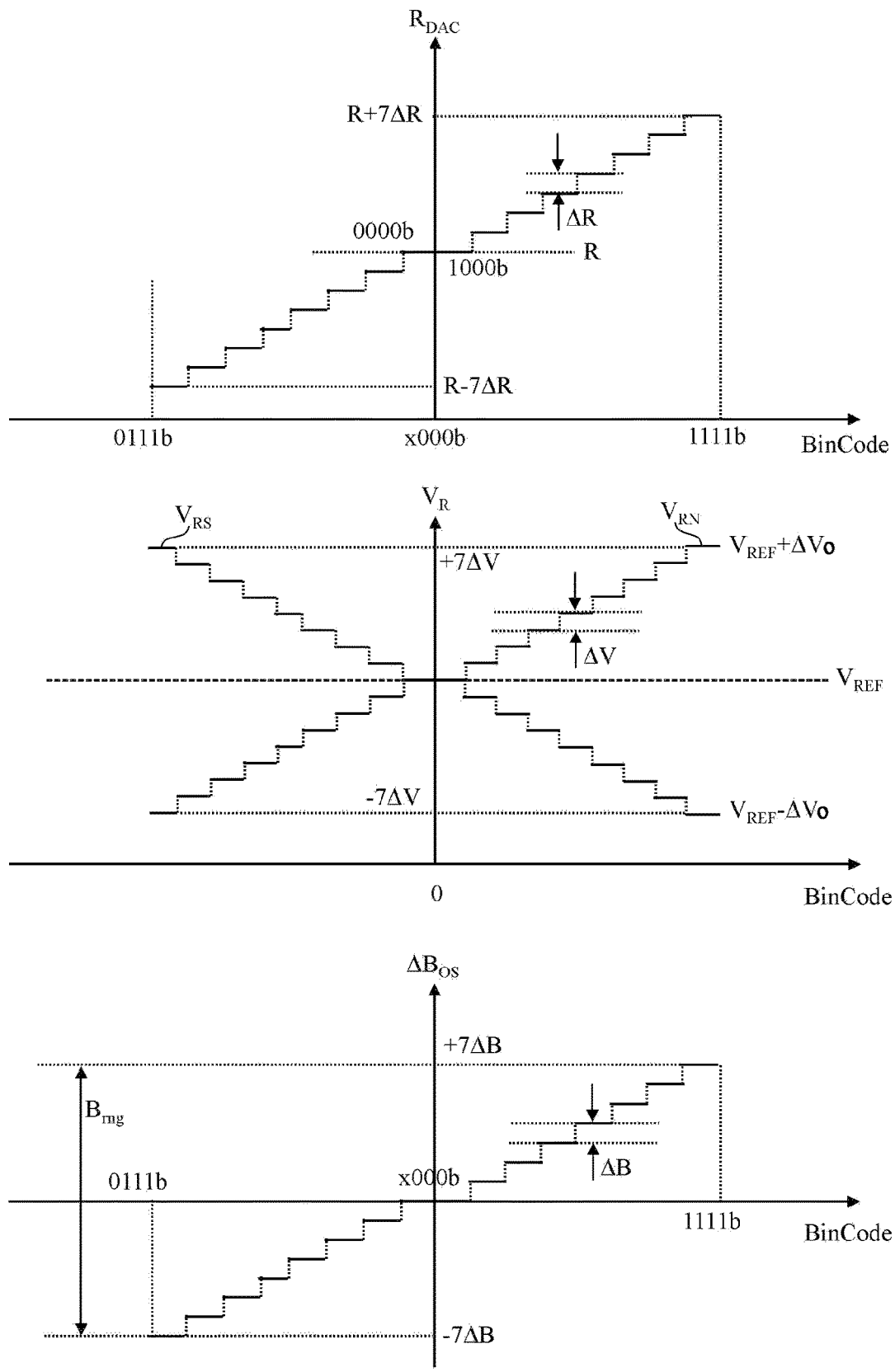
FIG. 14 is a schematic view illustrating a relationship between a control signal, an adjusting current, a comparator reference voltage, and a magnetic offset in the semiconductor device according to the second embodiment.

FIG. 14 is a schematic view illustrating an example of a resistance value $R_{DAC}$ of the second resistor 705, a reference voltage $V_{REF}$, and a magnetic offset adjustment amount $\Delta B_{OS}$ with respect to the binary adjustment code BinCode. Herein, polygonal lines $V_{RN}$ and $V_{RS}$ illustrated in the chart (the middle chart of the three charts illustrated in FIG. 14) of the comparator reference voltage $V_R$ with respect to the binary adjustment code BinCode are the same as the polygonal lines $V_{RN}$ and $V_{RS}$ illustrated in FIG. 10.

There are a total of 16 adjustment codes, including D [3:0]=0000b to 1111b, with the MSB (D23) corresponding to a polarity code of the adjustment, and the lower-order bits (D22 to D20) corresponding to an absolute value of the adjustment amount. The resistance value $R_{DAC}$ is configured to become $R_{DAC}$=R−7 ΔR when D [3:0]=0111b, and become $R_{DAC}$=R+7 ΔR when D [3:0]=1111b. Since the comparator reference voltage $V_R$ and the magnetic offset adjustment amount $\Delta B_{OS}$ are the same as those in FIG. 10, descriptions thereof will be omitted.

Since the $\Delta B_{OS}$ characteristic of the semiconductor device 1B configured as described above with respect to the binary adjustment code BinCode represented in FIG. 14 is the same as that of FIG. 10, it is possible to operate to adjust $B_{OS}$ in a manner similar to the semiconductor device 1A. In other words, by obtaining the same operation as that of the semiconductor device 1A, the same effect as that of the semiconductor device 1A can be obtained.

As described above, according to the present embodiment, by switching the resistance value of the second resistor 705 used for generating the comparator reference voltage $V_R$ (=$V_{REF} \pm \Delta Vo$), it is possible to obtain symmetric magnetoelectric conversion switching characteristics between the S-pole and the N-pole to obtain the same effect as in the first embodiment.

In the second embodiment described above, the second resistor 705 is configured to be adjustable by 3 bits in the positive and negative each; however, it may also be configured with any adjustment bit number N. In this case, it is possible to obtain a $B_{OS}$ adjustment range and a $B_{OS}$ adjustment resolution corresponding to the adjustment bit number N.

Although the configuration and operation of the semiconductor device according to the embodiments of the present invention have been described above, the present invention is not limited to the above-described embodiments. At the implementation stage, it is possible to implement the present invention in various forms other than the above-mentioned examples, and various omissions, replacements, and changes may be made without departing from the gist of the invention.

Although the magnetic switch included in the above-mentioned semiconductor devices 1A to 1B is a so-called alternation detection type magnetic switch, it may also be configured as a bipolar detection type or unipolar detection type magnetic switch. When the semiconductor devices 1A to 1B are configured as a bipolar detection type magnetic switch, an appropriate logic circuit may be added to a stage subsequent to the comparator 60 so that the state transition can be appropriately controlled.

When the semiconductor devices 1A to 1B are formed as a bipolar detection type magnetic switch, even without polarity management of the magnets to be combined, it is possible to reduce the variation in the detection distance of the magnetic body detection mechanism in which the semiconductor device is incorporated. Further, when the semiconductor devices 1A to 1B are formed as a unipolar detection type magnetic switch, since the accuracy of magnetic sensitivity of the polarity of a target can be improved, it is possible to reduce the variation in the detection distance of the magnetic body detection mechanism in which the semiconductor device is incorporated.

The semiconductor devices 1A to 1B may be further provided with a switch network for switching the electrodes 30a to 30d serving as input terminals for supplying the drive current $I_{DRV}$ to the Hall element 30 and output terminals for outputting the differential output voltage $V_H$ from the Hall element 30.

In the above-described embodiments, it has been described as an example that the Hall element 30 includes the electrodes 30a to 30d formed at the four corners of a square diffusion region, and has a configuration of a so-called horizontal Hall element which detects a magnetic field orthogonal to the surface of the semiconductor substrate 2 (see, for example, FIG. 1); however, the present invention is not limited thereto. For example, the Hall element 30 may be configured as a 5-terminal vertical Hall element which detects a magnetic field parallel to the surface of the semiconductor substrate 2. The 5-terminal vertical Hall element is equivalently operated as a 4-terminal element by short-circuiting the electrodes at two ports thereof.

In the above-described embodiments, the decoders 94A and 94B are not limited to the circuit configurations using the logic gate elements exemplified in FIG. 4 and FIG. 11, respectively.

The logic gate elements and circuit configuration to be used may not be limited as long as the configuration can obtain an equivalent logical operation result when the above-described input signal is received.

Further, in the above-described embodiments, although the switch circuit has been described as an example of a means for switching the current values of the current sources 42 and 43 or the resistance value of the second resistor 705, the means for switching the current value or the resistance value is not limited thereto. The switches SC1 to SC6 and SS1 to SS6 may be, for example, MEMS-based mechanical switches, electronic switches such as transistors, or a combination thereof.

Further, the memory circuits 93A and 93B in the above-described embodiments may be of any type as long as they can output binary signals having a required bit number. The memory circuits 93A and 93B may be, for example, a rewritable non-volatile memory such as an EEPROM, or may be a non-volatile memory that can be written only once, such as a fuse ROM. Further, in the case where the bit is set based on a self-diagnosis result when the power is turned on, a volatile memory such as an SRAM may be used.

In the above-described embodiments, although it has been described that the Hall element 30 is a single Hall element, from the viewpoint of suppressing the absolute value and the variation of the magnetic offset $B_{OSDP}$, a configuration in which a plurality of Hall element cells are connected in parallel may be adopted. Since the deviation from the design values of the operating point and the returning point at the time of no adjustment can be suppressed, the adjustment range and the adjustment resolution required for the adjustment circuit can be reduced, and the circuit scale can be reduced.

In the above-described embodiments, the amplifier 50 of the differential input single-phase output type and the comparator 60 of the single-phase input type have been described as configuration examples. However, the amplifier 50 and the comparator 60 are not limited to these examples, and in the semiconductor devices 1A to 1B, an amplifier 50 of the differential input/output type and a comparator 60 of the differential input type may also be applied. In this case, it is possible to provide the semiconductor devices 1A to 1B with a magnetic switch which is relatively robust against in-phase noise superimposed from a power source or the like.

In the above-described embodiments, it has been described as an example that the magnetic offset adjustment amount $\Delta B_{OS}$ is 0 when D [3:0]=0000b and when D [3:0]=1000b, i.e., the magnetic offset adjustment amount $\Delta B_{OS}$ is set to have an adjustment width of 7 levels in the positive and negative including when the magnetic offset adjustment amount is 0 (zero), but the present invention is not limited to this example. For example, excluding the case where the magnetic offset adjustment amount $\Delta B_{OS}$ is 0, the magnetic offset adjustment amount $\Delta B_{OS}$ may be set to have an adjustment width of eight levels in the positive and negative. In the present embodiment, since the case where the magnetic offset adjustment amount is 0 corresponds to the case where there is no magnetic offset adjustment, the semiconductor devices 1A to 1B can also be understood as a semiconductor device including a magnetic switch capable of switching the presence/absence of adjustment of the magnetic offset.

The above-described embodiments and their modifications are included in the scope and gist of the invention, and are also included in the scope of the invention and its equivalents described in the appended claims.

What is claimed is:

1. A semiconductor device comprising a magnetic switch provided on a semiconductor substrate, the magnetic switch comprising:
   a Hall element comprising at least four electrodes;
   a switch circuit which comprises an input terminal pair supplied with a differential output voltage from two electrodes among the four electrodes, an output terminal pair, and a control terminal, and is capable of switching a connection state between the input terminal pair and the output terminal pair between a first state and a second state based on a control signal supplied to the control terminal of the switch circuit;
   an amplifier which amplifies a difference between signals supplied from the output terminal pair of the switch circuit;
   a reference voltage circuit which generates a reference voltage based on a reference common mode voltage and the control signal which are received;
   a comparator which compares an output signal of the amplifier with the reference voltage outputted from the reference voltage circuit; and
   a latch circuit which latches an output voltage of the comparator and outputs the control signal, and which performs control to switch the reference voltage of the reference voltage circuit to one of a voltage obtained by applying an adjustment value to a reference value in a positive direction and a voltage obtained by applying the adjustment value to the reference value in a negative direction, according to the control signal corresponding to an output signal of the comparator.

2. The semiconductor device according to claim 1, wherein
   the reference voltage circuit comprises: a control terminal; a memory circuit comprising an output port outputting an adjustment code signal of N bits taking a natural number N as an adjustment bit number; a decoder which comprises an output port outputting a current control signal and generates the current control signal according to the adjustment code signal and the control signal received at the control terminal of the reference voltage circuit; a first variable current source; a second variable current source; a reference common mode voltage terminal; an output terminal; and a resistor comprising a first port connected to the reference common mode voltage terminal, and a second port connected to the output terminal, wherein the first variable current source comprises a first port receiving the current control signal, and a second port connected to the output terminal, wherein based on the current control signal containing a first logic or a second logic, an output current value is controlled to zero in response to receiving the current control signal which is the first logic, and the output current value is controlled to a current value based on the adjustment code signal in response to receiving the current control signal which is the second logic, and the second variable current source comprises a first port receiving the current control signal containing a first logic or a second logic, and a second port connected to the output terminal, wherein based on the current control signal, an output current value is controlled to a current value based on the adjustment code signal in response to receiving the current control signal which is the first logic, and the output current value is controlled to zero in response to receiving the current control signal which is the second logic.

3. The semiconductor device according to claim 1, wherein the reference voltage circuit comprises: a control terminal; a memory circuit comprising an output port outputting an adjustment code signal of N bits taking a natural number N as an adjustment bit number; a common mode potential terminal; an output terminal; a current source comprising an output port connected to the output terminal; a resistor comprising a first port connected to the common mode potential terminal, and a second port connected to the output terminal; and a decoder which comprises an output port outputting a resistance control signal and generates the resistance control signal according to the adjustment code signal and the control signal received at the control terminal of the reference voltage circuit, wherein the resistor is a variable resistor in which, based on the resistance control signal containing a first logic or a second logic, a resistance value is controlled to a reference resistance value in response to receiving the resistance control signal which is the first logic, and the resistance value is controlled to a resistance value different from the reference resistance value in response to receiving the resistance control signal which is the second logic.

4. The semiconductor device according to claim 1, wherein the reference voltage circuit is configured so that the adjustment value is adjustable at a plurality of levels.

5. The semiconductor device according to claim 4, wherein the plurality of levels comprise a level at which the adjustment value is zero.

6. The semiconductor device according to claim 1, wherein the Hall element is a horizontal Hall element which detects a magnetic field orthogonal to a surface of the semiconductor substrate or a vertical Hall element which detects a magnetic field parallel to the surface of the semiconductor substrate.

7. The semiconductor device according to claim 1, wherein the Hall element is a Hall element composed of a plurality of Hall element cells connected in parallel.

* * * * *